(12) United States Patent
Lee et al.

(10) Patent No.: US 10,340,320 B2
(45) Date of Patent: Jul. 2, 2019

(54) SUBSTRATE FOR DISPLAY DEVICE AND DISPLAY DEVICE INCLUDING THE SAME

(71) Applicant: LG Display Co., Ltd., Seoul (KR)

(72) Inventors: Jong-Won Lee, Seoul (KR); Jung-Ho Bang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/809,946

(22) Filed: Nov. 10, 2017

(65) Prior Publication Data

US 2018/0175127 A1   Jun. 21, 2018

(30) Foreign Application Priority Data

Dec. 20, 2016   (KR) ........................ 10-2016-0174261

(51) Int. Cl.
*H01L 27/32* (2006.01)
*H01L 27/12* (2006.01)
*H01L 29/786* (2006.01)

(52) U.S. Cl.
CPC ...... *H01L 27/3262* (2013.01); *H01L 27/1222* (2013.01); *H01L 27/1225* (2013.01); *H01L 27/1248* (2013.01); *H01L 27/1251* (2013.01); *H01L 27/1255* (2013.01); *H01L 27/3265* (2013.01); *H01L 27/3276* (2013.01); *H01L 27/3246* (2013.01); *H01L 27/3272* (2013.01);
(Continued)

(58) Field of Classification Search
CPC ............. H01L 27/1251; H01L 27/3246; H01L 27/3262; H01L 27/3265
See application file for complete search history.

(56) References Cited

U.S. PATENT DOCUMENTS

2002/0051099 A1* 5/2002 Moon ............... G02F 1/136213
349/1
2010/0264412 A1* 10/2010 Yamazaki ............... H01L 27/12
257/43

(Continued)

FOREIGN PATENT DOCUMENTS

EP   2 500 946 A2   9/2012

OTHER PUBLICATIONS

European Patent Office, Extended European Search Report and Opinion, EP Patent Application No. 17208677.9, dated May 29, 2018, eight pages.

*Primary Examiner* — Dung A. Le
(74) *Attorney, Agent, or Firm* — Fenwick & West LLP

(57) ABSTRACT

A substrate for a display device and a display device including the same are disclosed. The substrate includes a first thin-film transistor including an oxide semiconductor layer, a second thin-film transistor spaced apart from the first thin-film transistor and including a polycrystalline semiconductor layer, and a storage capacitor including at least two storage electrodes. One of the at least two storage electrodes is located in the same plane and is formed of the same material as gate electrodes of the first thin-film transistor and the second thin-film transistor, and another one of the at least two storage electrodes is located in the same plane and is formed of the same material as source and drain electrodes of the first thin-film transistor and the second thin-film transistor. Accordingly, lower power consumption and a larger area of the substrate are realized.

22 Claims, 10 Drawing Sheets

(52) U.S. Cl.
CPC .... *H01L 29/7869* (2013.01); *H01L 29/78675* (2013.01); *H01L 2227/323* (2013.01)

(56) References Cited

U.S. PATENT DOCUMENTS

| | | | |
|---|---|---|---|
| 2011/0012106 A1* | 1/2011 | Yamazaki | H01L 27/1225 257/43 |
| 2013/0015449 A1 | 1/2013 | Lee et al. | |
| 2013/0134415 A1* | 5/2013 | Godo | H01L 29/66969 257/43 |
| 2013/0153904 A1 | 6/2013 | Nishimura et al. | |
| 2014/0042434 A1* | 2/2014 | Yamazaki | H01L 29/7869 257/43 |
| 2014/0197382 A1* | 7/2014 | Kim | H01L 29/45 257/40 |
| 2014/0353619 A1* | 12/2014 | Park | H01L 27/3276 257/40 |

\* cited by examiner

SUBSTRATE FOR DISPLAY DEVICE AND DISPLAY DEVICE INCLUDING THE SAME

CROSS-REFERENCE TO RELATED APPLICATIONS

This application claims priority to Republic of Korea Patent Application No. 10-2016-0174261, filed on Dec. 20, 2016, which is hereby incorporated by reference as if fully set forth herein.

BACKGROUND

Field of the Invention

The present disclosure relates to a substrate for a display device and a display device including the same, and more particularly to a substrate for a display device, which is capable of realizing lower power consumption and a larger area, and a display device including the same.

Discussion of the Related Art

An image display device, which displays various kinds of information on a screen, is a core technology of the information and communication age, and is currently being developed with the aims of a thinner and lighter design, greater portability, and higher performance. Hence, flat panel display devices, which may reduce the disadvantageously heavy weight and volume of a cathode ray tube (CRT), are in the spotlight.

Examples of flat panel display devices include liquid crystal display (LCD) devices, plasma display panel (PDP) devices, organic light-emitting display (OLED) devices, and electrophoretic display (ED) devices.

A flat panel display device includes thin-film transistors arranged in pixels. In order to apply a display device to portable appliances, low power consumption is required. However, it is difficult to realize low power consumption with technologies related to display devices that have been developed to date.

SUMMARY

Accordingly, the present disclosure is directed to a substrate for a display device and a display device including the same that substantially obviate one or more problems due to limitations and disadvantages of the related art.

An object of the present disclosure is to provide a substrate for a display device, which is capable of realizing lower power consumption and a larger area, and a display device including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a substrate for a display device includes a first thin-film transistor including an oxide semiconductor layer, a second thin-film transistor spaced apart from the first thin-film transistor and including a polycrystalline semiconductor layer, and a storage capacitor including at least two storage electrodes. One of the at least two storage electrodes is located in the same plane and is formed of the same material as gate electrodes of the first thin-film transistor and the second thin-film transistor, and another one of the at least two storage electrodes is located in the same plane and is formed of the same material as source and drain electrodes of the first thin-film transistor and the second thin-film transistor.

Embodiments relate to a display device. The display device includes a substrate and a pixel on the substrate. The pixel includes a first thin-film transistor (TFT) on the substrate, a storage capacitor on the substrate, and a light-emitting device electrically connected to the storage capacitor. The first TFT includes a first gate electrode, at least a first part of an interlayer insulation film on the first gate electrode, a first gate insulation film on the first part of the interlayer insulation film, and a first active layer formed of oxide semiconductor on the first gate insulation film. The storage capacitor includes a first storage electrode, at least a second part of the interlayer insulations film on the first storage electrode, and a second storage electrode on the second part of the interlayer insulation film. The second storage electrode is physically separated from the first gate insulation film In one embodiment, the first gate insulation film and the second storage electrode contact the interlayer insulation film.

In one embodiment, the first storage electrode is in a same layer as the first gate electrode.

In one embodiment, the interlayer insulation film is formed of silicon nitride (SiNx) and the first gate insulation film is formed of silicon oxide (SiOx).

In one embodiment, the first TFT further includes a first source electrode and a first drain electrode electrically connected to the first active layer. The second storage electrode may be in a same layer as the first source electrode and the first drain electrode.

In one embodiment, the first TFT further includes a first source electrode and a first drain electrode electrically connected to the first active layer. The first source electrode or the first drain electrode may contact a side surface of the first gate insulation film.

In one embodiment, the first source electrode or the first drain electrode contacts a side surface of the first active layer.

In one embodiment, the display device further includes a second TFT on the substrate. The second TFT includes a second active layer formed of polycrystalline silicon, at least a first part of a second gate insulation film on the second active layer, and a second gate electrode on the first part of the second gate insulation film. The second gate electrode may be in a same layer as the first gate electrode.

In one embodiment, the first active layer is disposed above the second active layer.

In one embodiment, the display device further includes a third TFT disposed in a non-display area of the substrate. The third TFT includes a third active layer formed of poly-Si.

In one embodiment, the display device further includes a gate-driving unit disposed in the non-display area to drive gate lines in a display area of the substrate, a data-driving unit disposed in the non-display area for driving data lines in the display area, and a multiplexer for distributing data voltage from the data-driving unit to the data lines. The third TFT is included in at least one of the multiplexer and the gate-driving unit.

In one embodiment, the first TFT is a switching TFT of the pixel, and the second TFT is a driving TFT of the pixel.

In one embodiment, the storage capacitor further includes a third storage electrode on the substrate, and at least a second part of the second insulation film on the third storage electrode.

In one embodiment, the third storage electrode is in a same layer as the second active layer.

In one embodiment, the light-emitting device includes an anode electrode, a light-emitting stack, and a cathode electrode. The anode electrode overlaps with the first TFT, the second TFT, and the storage capacitor.

In one embodiment, the light-emitting device includes an anode electrode, a light-emitting stack, and a cathode electrode. The second TFT includes a drain electrode electrically connected to the second active layer. The display device further includes a connection electrode electrically connected to the drain electrode and the anode electrode.

In one embodiment, the light-emitting device includes an anode electrode, a light-emitting stack, and a cathode electrode. The anode electrode includes a transparent conductive film and an opaque conductive film.

In one embodiment, the light-emitting device includes an anode electrode, a light-emitting stack, and a cathode electrode. The display device further includes a bank layer on at least a part of the anode electrode. The bank layer may include a light-shielding material selected from at least one among a color pigment and organic black and carbon materials.

In one embodiment, the display device further includes a color filter on the light-emitting device.

Embodiments also relate to a method of forming a display device. A first conductive layer is patterned using a first mask to form a first gate electrode of a first thin-film transistor (TFT) and a first storage electrode of a storage capacitor on the substrate. An interlayer insulation film is formed on the first gate electrode and the first storage electrode. An insulation film is patterned using a second mask to form a first gate insulation film on at least a first part of the interlayer insulation film. An oxide semiconductor layer is patterned using the second mask to form a first active layer of the first TFT on the first gate insulation film. A second storage electrode of the storage capacitor is formed on at least a second part of the interlayer insulation film. The second storage electrode does not contact the first gate insulation film.

In one embodiment, the first gate insulation film and the second storage electrode contacts the first interlayer insulation film.

In one embodiment, a second conductive layer is patterned using a third mask to form a first source electrode and a first drain electrode of the first TFT on the first active layer. Forming the second storage electrode includes patterning the second conductive layer using the third mask to form the second storage electrode.

In one embodiment, the interlayer insulation film is formed of silicon nitride (SiNx) and the first gate insulation film is formed of silicon oxide (SiOx).

In one embodiment, a second active layer of a second TFT is formed on the substrate. A second gate insulation film is formed on the second active layer. A second gate electrode is formed on at least a part of the second gate insulation film. The second active layer, the second gate insulation film, and the second gate electrode may be disposed below the interlayer insulation film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
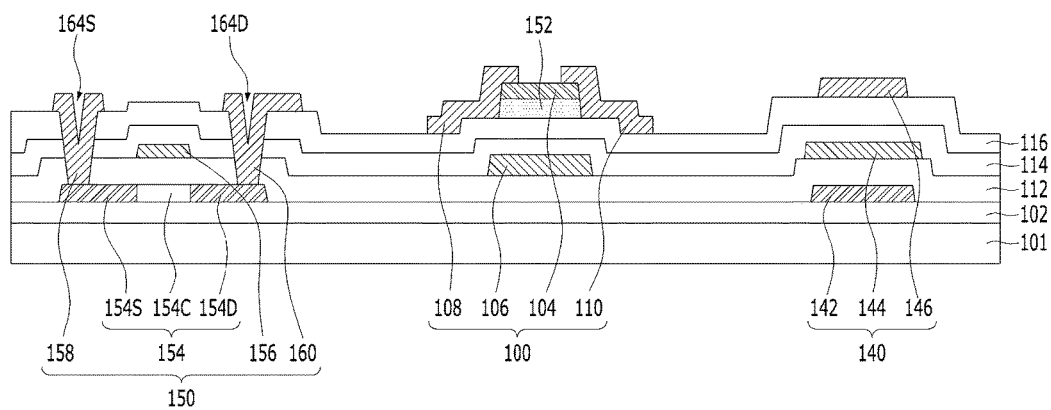
FIG. 1 is a sectional view illustrating a substrate for a display device according to an embodiment of the present disclosure.

FIG. 1 is a sectional view illustrating a substrate for a display device according to an embodiment of the present disclosure.

A substrate for a display device shown in FIG. 1 includes first and second thin-film transistors 100 and 150 and a storage capacitor 140.

The first thin-film transistor 100 having a bottom gate configuration includes a first gate electrode 106, an oxide semiconductor layer 104, a first source electrode 108, and a first drain electrode 110.

The first gate electrode 106, as shown in FIG. 1, is formed on a first gate insulation film 112, and may overlap the oxide semiconductor layer 104 with first and second interlayer insulation films 114 and 116 and a second gate insulation film 152 interposed therebetween. In this case, the first gate electrode 106 is disposed on the first gate insulation film 112, on which a second gate electrode 156 is also disposed, and is formed of the same material as the second gate electrode 156. Accordingly, the first and second gate electrodes 106 and 156 may be formed through the same mask process, and therefore the number of mask processes may be reduced.

The oxide semiconductor layer 104 is formed on the second gate insulation film 152 so as to overlap the first gate electrode 106, thereby forming a channel between the first source electrode 108 and the first drain electrode 110. The oxide semiconductor layer 104 is formed of oxide including at least one metal selected from among Zn, Cd, Ga, In, Sn, Hf, and Zr. Since the first thin-film transistor 100 including this oxide semiconductor layer 104 has advantages of higher electron mobility and lower off-current than the second thin-film transistor 150 including a polycrystalline semiconductor layer 154, it is suitable for application to a switching thin-film transistor, in which an On-time period is short but an Off-time period is long. The oxide semiconductor layer 104 may be disposed above the first gate electrode 106 so as to effectively ensure the stability of the device.

The second gate insulation film 152, which has the same shape as the oxide semiconductor layer 104, is formed between the oxide semiconductor layer 104 and at least a first part of the second interlayer insulation film 116. The second gate insulation film 152 may contact the second interlayer insulation film 116. At this time, the second gate insulation film 152 is formed of a material having a selective etch ratio different from that of the first gate insulation film 112 and the first and second interlayer insulation films 114 and 116. For example, the second gate insulation film 152 is formed of SiOx, which is an oxide film, and the first gate insulation film 112 and the first and second interlayer insulation films 114 and 116 are formed of SiNx, which is a nitride film. Accordingly, it is possible to prevent the second interlayer insulation film 116, which is exposed during a dry-etching process for forming the second gate insulation film 152 and the oxide semiconductor layer 104, from being damaged by a dry-etching gas used for the dry-etching process. Further, it is possible to prevent the second gate insulation film 152 and the oxide semiconductor layer 104, which are exposed during a dry-etching process for forming source and drain contact holes 164S and 164D that penetrate the first gate insulation film 112 and the first and second interlayer insulation films 114 and 116, from being damaged by a dry-etching gas used for the dry-etching process.

The second gate insulation film 152 is an inorganic insulation film formed of, for example, silicon oxide (SiOx), which has lower hydrogen particle content than the first gate insulation film 112. Accordingly, it is possible to prevent hydrogen contained in the first gate insulation film 112 and hydrogen contained in the polycrystalline semiconductor layer 154 from being diffused to the oxide semiconductor layer 104 during a heat treatment process performed on the oxide semiconductor layer 104.

Each of the first source electrode 108 and the first drain electrode 110 may be a single layer or multiple layers disposed on the second interlayer insulation film 116 and formed of any one selected from among molybdenum (Mo), aluminum (Al), chrome (Cr), gold (Au), titanium (Ti), nickel (Ni), neodymium (Nd), and copper (Cu), or an alloy thereof. However, the embodiment is not limited thereto. The first source electrode 108 and the first drain electrode 110 are formed to face each other with the channel of the oxide semiconductor layer 104 interposed therebetween. Meanwhile, an etch stopper (not shown) may be formed on the oxide semiconductor layer 104 that is exposed between the first source electrode 108 and the first drain electrode 110. The etch stopper protects the oxide semiconductor layer 104, exposed between the first source electrode 108 and the first drain electrode 110, from oxygen and moisture, thereby preventing damage to the oxide semiconductor layer 104. The first source electrode 108 and the first drain electrode 110 may contact side surfaces of the second gate insulation film 152 that are exposed through the dry-etching process.

The second thin-film transistor 150 having a top-gate configuration is disposed on a substrate 101 so as to be spaced apart from the first thin-film transistor 100. The second thin-film transistor 150 includes a polycrystalline semiconductor layer 154, a second gate electrode 156, a second source electrode 158, and a second drain electrode 160.

The polycrystalline semiconductor layer 154 is formed on a buffer layer 102 that covers the substrate 101. The polycrystalline semiconductor layer 154 includes a channel region 154C, a source region 154S, and a drain region 154D. The channel region 154C overlaps the second gate electrode 156 with the first gate insulation film 112 interposed therebetween, and forms a channel between the second source electrode 158 and the second drain electrode 160. The source region 154S is electrically connected to the second source electrode 158 through a source contact hole 164S. The drain region 154D is electrically connected to the second drain electrode 160 through a drain contact hole 164D. Since the polycrystalline semiconductor layer 154 has high mobility, low power consumption, and high reliability, it is suitable for applications as a gate-driving unit for driving gate lines and/or to a multiplexer (MUX).

The second gate electrode 156 overlaps the channel region 154C of the polycrystalline semiconductor layer with the first gate insulation film 112 interposed therebetween. The second gate electrode 156 has a smaller line width than the first gate electrode 106 and the intermediate storage electrode 144. The second gate electrode 156 may be a single layer or multiple layers formed of the same material as the first gate electrode 106, e.g. any one selected from among molybdenum (Mo), aluminum (Al), chrome (Cr), gold (Au), titanium (Ti), nickel (Ni), neodymium (Nd), and copper (Cu), or an alloy thereof. However, the embodiments are not limited thereto. The first gate insulation film 112 is positioned on the polycrystalline semiconductor layer 154, and is an inorganic insulation film formed of, for example, silicon nitride (SiNx), which has higher hydrogen particle content than the second gate insulation film 152. The hydrogen particles contained in the first gate insulation film 112 are diffused to the polycrystalline semiconductor layer 154 during a hydrogenation process, thereby enabling pores in the polycrystalline semiconductor layer 154 to be filled with hydrogen. Accordingly, the polycrystalline semiconductor layer 154 is stabilized, thus preventing deterioration of the properties of the second thin-film transistor 150.

The second source electrode 158 is connected to the source region 154S of the polycrystalline semiconductor layer 154 through the source contact hole 164S that penetrates the first gate insulation film 112 and the first and second interlayer insulation films 114 and 116.

The second drain electrode 160 faces the second source electrode 158, and is connected to the drain region 154D of the polycrystalline semiconductor layer 154 through the drain contact hole 164D that penetrates the first gate insulation film 112 and the first and second interlayer insulation films 114 and 116. Since the second source electrode 158 is in the same layer and is formed of the same material as the first source electrode 108, and since the second drain electrode 160 is in the same layer and is formed of the same material as the first drain electrode 110, the first and second source electrodes 108 and 158 and the first and second drain electrodes 110 and 160 may be formed at the same time through the same mask process.

After the activation and hydrogenation processes of the polycrystalline semiconductor layer 154 of the second thin-film transistor 150, the oxide semiconductor layer 104 of the first thin-film transistor 100 is formed. That is, the oxide semiconductor layer 104 is disposed above the polycrystalline semiconductor layer 154. Accordingly, the oxide semiconductor layer 104 is not exposed to the high-temperature atmosphere of the activation and hydrogenation processes of the polycrystalline semiconductor layer 154, thereby preventing damage to the oxide semiconductor layer 104 and therefore improving reliability.

The storage capacitor 140 includes a first storage capacitor and a second storage capacitor, which are connected in parallel.

The first storage capacitor is formed such that a lower storage electrode 142 and an intermediate storage electrode 144 overlap each other with the first gate insulation film 112 interposed therebetween. The second storage capacitor is formed such that the intermediate storage electrode 144 and an upper storage electrode 146 overlap each other with at least one of the first and second interlayer insulation films 114 and 116 interposed therebetween.

Figure 2:
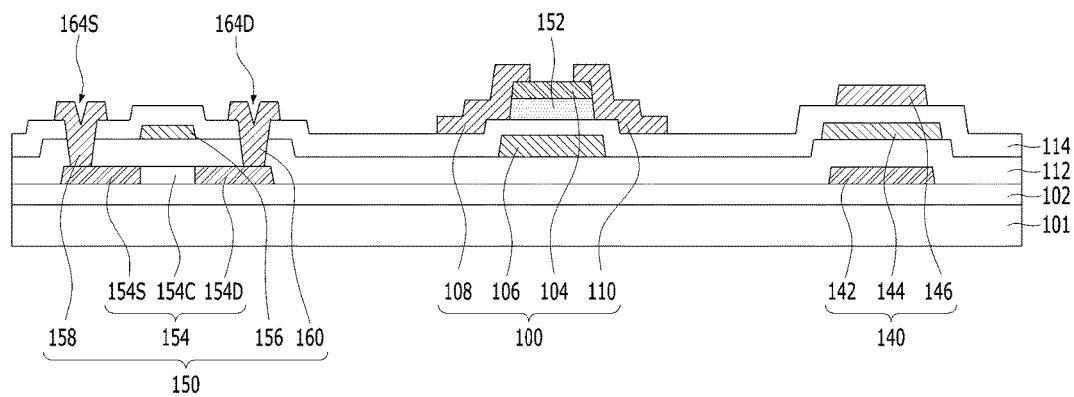
FIG. 2 is a sectional view illustrating another exemplary substrate for a display device according to another embodiment of the present disclosure.

The lower storage electrode 142 is disposed on the buffer film 102, and is positioned in the same layer and is formed of the same material as the polycrystalline semiconductor layer 154. The intermediate storage electrode 144 is disposed on the first gate insulation film 112, and is positioned in the same layer and is formed of the same material as the second gate electrode 156. The upper storage electrode 146 is disposed on the second interlayer insulation film 116, and is positioned in the same layer and is formed of the same material as the source and drain electrodes 108, 158, 110, and 160. At this time, the first gate insulation film 112 and the first and second interlayer insulation films 114 and 116 are formed of an inorganic insulation material such as, for example, SiOx or SiNx. At least one of the first gate insulation film 112 and the first and second interlayer insulation films 114 and 116 may be formed of SiNx, which has a higher dielectric constant than SiOx. Accordingly, since the intermediate storage electrode 144 overlaps the lower storage electrode 142, with the first gate insulation film 112, which is formed of SiNx having a relatively high dielectric constant, interposed therebetween, the capacity of the first storage capacitor is increased in proportion to the dielectric constant. Similarly, since the upper storage electrode 146 overlaps the intermediate storage electrode 144 with the first and second interlayer insulation films 114 and 116, which are formed of SiNx having a relatively high dielectric constant, interposed therebetween, the capacity of the second storage capacitor is increased in proportion to the dielectric constant. At this time, to increase the capacity of the second storage capacitor, only the first and second interlayer insulation film 114 and 116 are interposed between the upper storage electrode 146 and the intermediate storage electrode 144. The second gate insulation film 152 over the intermediate storage electrode 144 is eliminated through etching process, and thus the upper storage electrode 146 is placed directly on the second interlayer insulation film 116. The upper storage electrode 146 does not contact the second gate insulation film 152, but contacts the second interlayer insulation film 116. On the other hand, in order to more increase the capacity of the second storage capacitor, as shown in FIG. 2, the second interlayer insulation film 116 may be eliminated, and only the first interlayer insulation film 114, which is formed of SiNx, may be interposed between the upper storage electrode 146 and the intermediate storage electrode 144.

Figure 3:
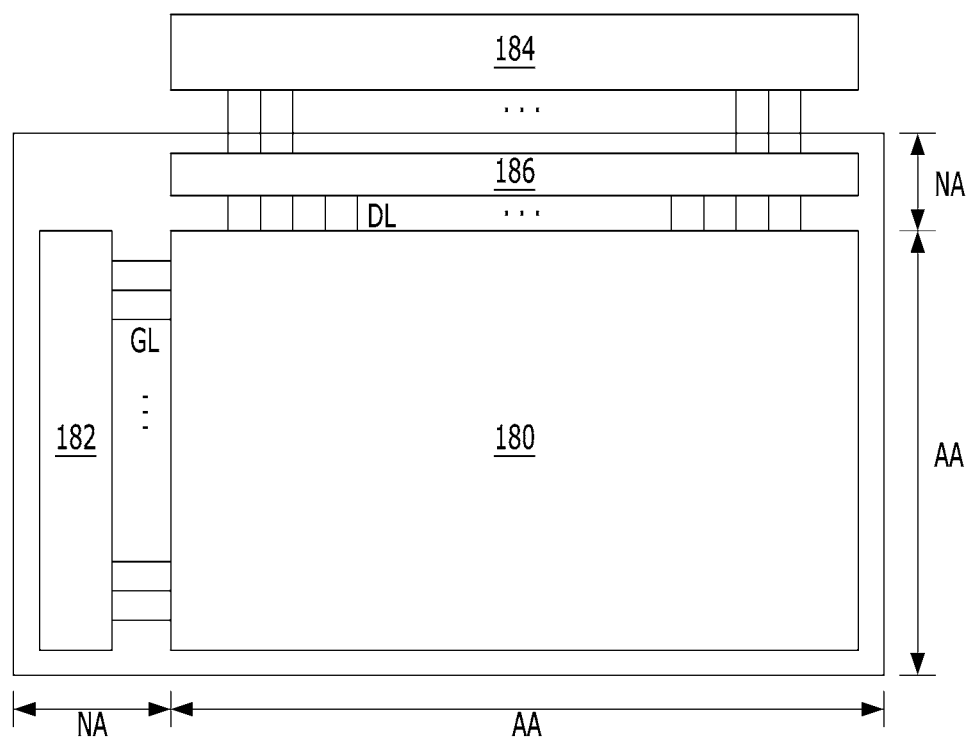
FIG. 3 is a block diagram illustrating a display device that includes the substrate for a display device according to an embodiment of the present disclosure.

The substrate for a display device having the above construction according to the present disclosure is applicable to the display device shown in FIG. 3.

The display device shown in FIG. 3 includes a display panel 180, a gate-driving unit 182 for driving gate lines GL of the display panel 180, and a data-driving unit 184 for driving data lines DL of the display panel 180.

The display panel 180 includes a display area AA and a non-display area NA surrounding the display area AA.

In the display area AA of the display panel 180, pixels are located at intersecting portions between the gate lines GL and the data lines DL. The pixels are arranged in a matrix form. Each of the pixels includes the storage capacitor 140 and at least one of the first thin-film transistor 100 and the second thin-film transistor 150.

The gate-driving unit 182 is disposed in the non-display area NA. The gate-driving unit 182 is configured using the second thin-film transistor 150 including the polycrystalline semiconductor layer 154. At this time, the second thin-film transistor 150 of the gate-driving unit 182 is formed simultaneously with the first and second thin-film transistors 100 and 150 in the display area AA through the same process.

A multiplexer 186 may be disposed between the data-driving unit 184 and the data lines DL. The multiplexer 186 distributes data voltage from the data-driving unit 184 to the data lines DL in a temporally divided manner, thereby reducing the number of output channels of the data-driving unit 184 and consequently reducing the number of data driving integrated circuits that compose the data-driving unit 184. The multiplexer 186 is configured using the second thin-film transistor 150 including the polycrystalline semiconductor layer 154. At this time, the second thin-film transistor 150 of the multiplex 186 may be directly formed on the substrate 101 for a display device together with the second thin-film transistor 150 of the gate-driving unit 182 and the first and second thin-film transistors 100 and 150 in the display area AA.

Figure 4:
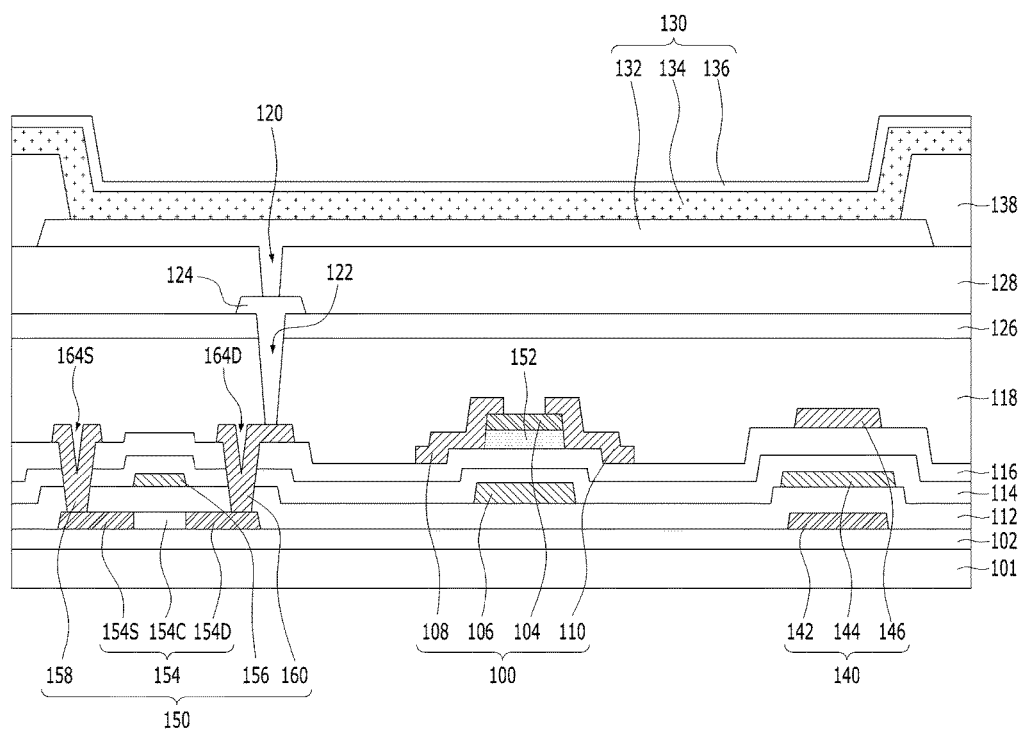
FIG. 4 is a sectional view illustrating an organic light-emitting diode display device that includes first and second thin-film transistors and a storage capacitor shown in FIG. 1 according to an embodiment of the present disclosure.

The above-described display device is applicable to a display device that requires a thin-film transistor, e.g. the organic light-emitting display device shown in FIG. 4 or a liquid crystal display device.

The organic light-emitting display device shown in FIG. 4 includes first and second thin-film transistors 100 and 150, a light-emitting diode 130 connected to the second thin-film transistor 150, and a storage capacitor 140.

The first thin-film transistor 100 including an oxide semiconductor layer 104 is applied to a switching transistor of each pixel located in the display area AA, and the second thin-film transistor 150 including a polycrystalline semiconductor layer 154 is applied to a driving transistor of each pixel located in the display area AA. Alternatively, the first thin-film transistor 100 including the oxide semiconductor layer 104 may be applied to a switching transistor for switching data voltage input to each pixel located in the display area AA and to a driving transistor connected to each light-emitting diode 130.

The second thin-film transistor 150 including the polycrystalline semiconductor layer 154 is applied to a transistor of a driving circuit of at least one of the gate-driving unit 182 located in the non-display area NA and the multiplexer 186.

Figure 5:
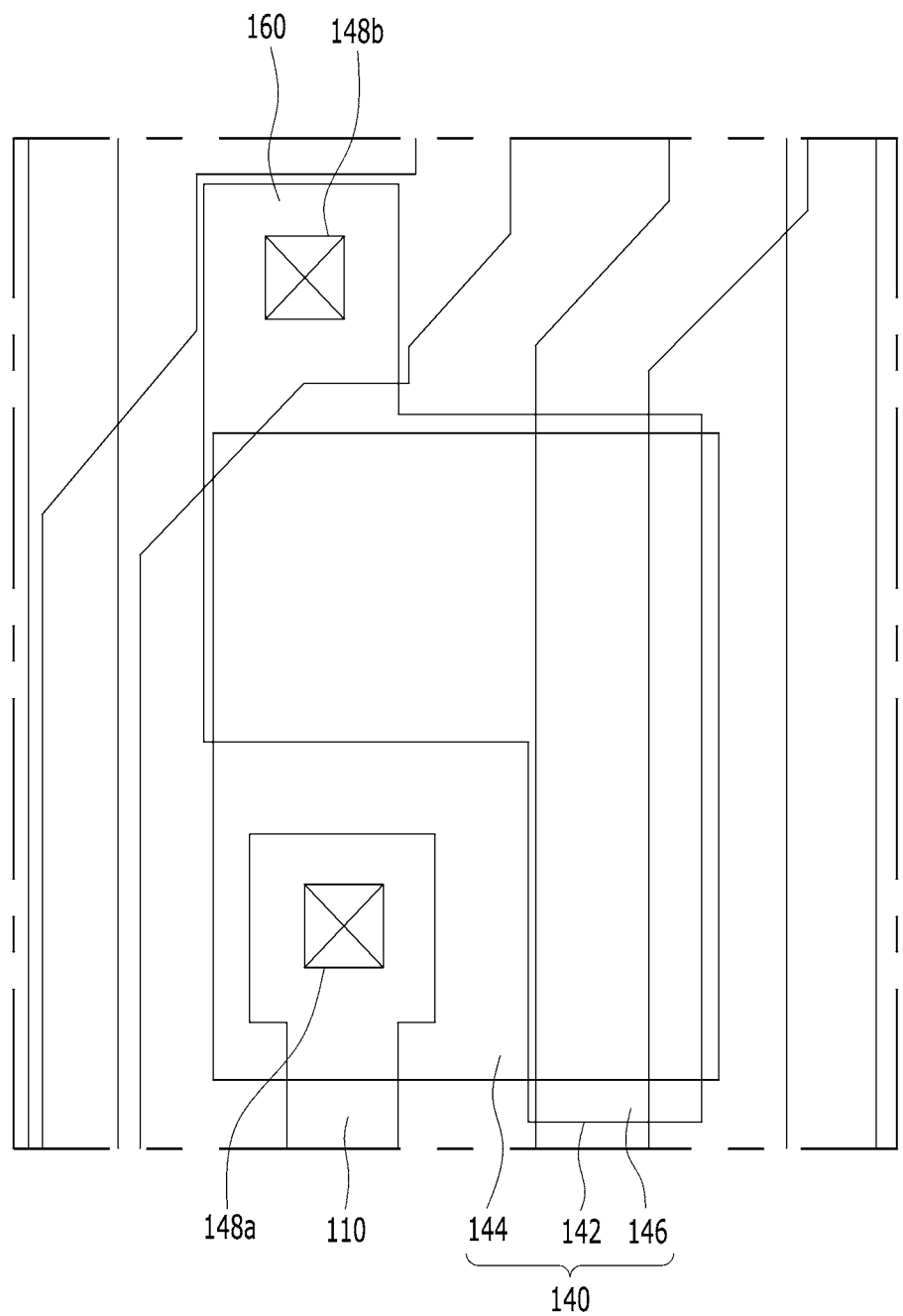
FIG. 5 is a plan view illustrating the storage capacitor shown in FIG. 4 according to an embodiment of the present disclosure.

The storage capacitor 140 includes a lower storage electrode 142, which is disposed on a buffer film 102, and an intermediate storage electrode 144, which overlaps the lower storage electrode 142 with a first gate insulation film 112 interposed therebetween. At this time, the lower storage electrode 142 is positioned in the same layer and is formed of the same material as the polycrystalline semiconductor layer 154, and the intermediate storage electrode 144 is positioned in the same layer and is formed of the same material as a second gate electrode 156. As shown in FIG. 5, the intermediate storage electrode 144 is connected to a drain electrode 110 of any one of the switching transistor and the driving transistor through a first storage contact hole 148a, and the lower storage electrode 142 and the upper storage electrode 146 are connected to a drain electrode 160 of the remaining one of the switching transistor and the driving transistor through a second storage contact hole 148b.

The light-emitting diode 130 is a light-emitting device, and includes an anode 132, which is connected to the second drain electrode 160 of the second thin-film transistor 150, at least one light-emitting stack 134, which is formed on the anode 132, and a cathode 136, which is formed on the light-emitting stack 134.

The anode 132 is connected to a pixel connection electrode 124, which is exposed through a second pixel contact hole 120 that penetrates a planarization layer 128. The pixel connection electrode 124 is connected to the second drain electrode 160, which is exposed through a first pixel contact hole 122 that penetrates first and second protective films 118 and 126. The anode 132 is formed in a multilayer structure including a transparent conductive film and an opaque conductive film having high reflection efficiency. The transparent conductive film is formed of a material having a relatively high work function, e.g. indium tin oxide (ITO) or indium zinc oxide (IZO), and the opaque conductive film is formed in a single-layer or multilayer structure including any one selected from among Al, Ag, Cu, Pb, Mo, and Ti or an alloy thereof. For example, the anode 132 may be formed in a structure such that a transparent conductive film, an opaque conductive film and a transparent conductive film are sequentially stacked, or such that a transparent conductive film and an opaque conductive film are sequentially stacked. The anode 132 is disposed on the planarization layer 128 so as to overlap a circuit area, in which the switching and driving transistors 100 and 150 and the storage capacitor 140 are disposed, as well as a light-emitting area defined by a bank 138, thereby increasing a light-emitting area.

The light-emitting stack 134 is formed by stacking, on the anode 132, a hole-related layer, an organic light-emitting layer, and an electron-related layer, either in that order or in the reverse order. In addition, the light-emitting stack 134 may include first and second light-emitting stacks, which are opposite each other with a charge generation layer interposed therebetween. In this case, an organic light-emitting layer of any one of the first and second light-emitting stacks generates blue light, and an organic light-emitting layer of the remaining one of the first and second light-emitting stacks generates yellow-green light, with the result that white light is generated via the first and second light-emitting stacks. The white light generated by the light-emitting stack 134 is introduced into a color filter (not shown) disposed on the light-emitting stack 134, and consequently a color image is realized. Alternatively, it may be possible to realize a color image in a way such that each light-emitting stack 134 generates colored light corresponding to each sub-pixel without a separate color filter. That is, a light-emitting stack 134 of a red (R) sub-pixel may generate red light, a light-emitting stack 134 of a green (G) sub-pixel may generate green light, and a light-emitting stack 134 of a blue (B) sub-pixel may generate blue light.

The bank 138 may be formed so as to expose the anode 132. The bank 138 may be formed of an opaque material (e.g. a black material) in order to prevent optical interference between neighboring sub-pixels. In this case, the bank 138 includes a light-shielding material including at least one selected from among a color pigment, organic black and carbon materials.

The cathode 136 is formed on the upper surface and the side surface of the light-emitting stack 134 so as to be opposite the anode 132 with the light-emitting stack 134 interposed therebetween. In the case in which the cathode 136 is applied to a top-emission-type organic light-emitting display device, the cathode 136 is a transparent conductive film formed of, for example, indium tin oxide (ITO) or indium zinc oxide (IZO).

As described above, according to the present disclosure, the first thin-film transistor 100 including the oxide semiconductor layer 104 is applied to a switching element of each pixel. The first thin-film transistor 100 including the oxide semiconductor layer 104 has lower off-current than the second thin-film transistor 150 including the polycrystalline semiconductor layer 154. Accordingly, the present disclosure may operate in a low-speed driving mode to lower a frame frequency for a still image or an image having a slow data update interval, thereby reducing power consumption. In addition, the oxide semiconductor layer 104 of the first thin-film transistor 100 has excellent saturation characteristics and therefore facilitates low-voltage operation.

Further, according to the present disclosure, the second thin-film transistor 150 including the polycrystalline semiconductor layer 154 is applied to a driving element of each pixel and a driving element of a driving circuit. Since the polycrystalline semiconductor layer 154 has higher mobility ($100 \text{ cm}^2/\text{Vs}$ or more), lower power consumption and higher reliability than the oxide semiconductor layer 104, it is capable of being applied to the gate-driving unit 182 and/or the multiplexer (MUX) 186.

FIGS. 6A to 6J are sectional views for explaining a method of manufacturing the organic light-emitting display device shown in FIG. 4.

Figure 6A:
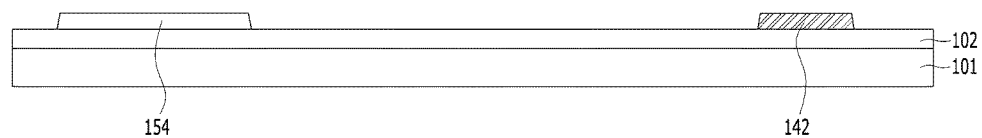
FIGS. 6A to 6J are sectional views for explaining a method of manufacturing the organic light-emitting display device shown in FIG. 4 according to an embodiment of the present disclosure.

Referring to FIG. 6A, the buffer layer 102 is formed on the substrate 101, and the polycrystalline semiconductor layer 154 and the lower storage electrode 142 are formed on the buffer layer 102.

Specifically, an inorganic insulation material, such as SiOx or SiNx, is deposited on the entire surface of the substrate 101, thereby forming the buffer layer 102 having a single-layer Or multilayer structure. Subsequently, an amorphous silicon thin film is formed on the substrate 101, on which the buffer layer 102 has been formed, using a low-pressure chemical vapor deposition (LPCVD) or plasma-enhanced chemical vapor deposition (PECVD) method. Subsequently, a polycrystalline silicon thin film is formed by crystallizing the amorphous silicon thin film. Subsequently, the polycrystalline semiconductor layer 154 and the lower storage electrode 142 are formed by patterning the polycrystalline silicon thin film through a photolithography process using a first mask and an etching process. Subsequently, the lower storage electrode 142, excluding the polycrystalline semiconductor layer 154, is selectively doped with impurities through a photolithography process using a second mask, thereby forming the lower storage electrode 142 having conductivity.

Figure 6B:
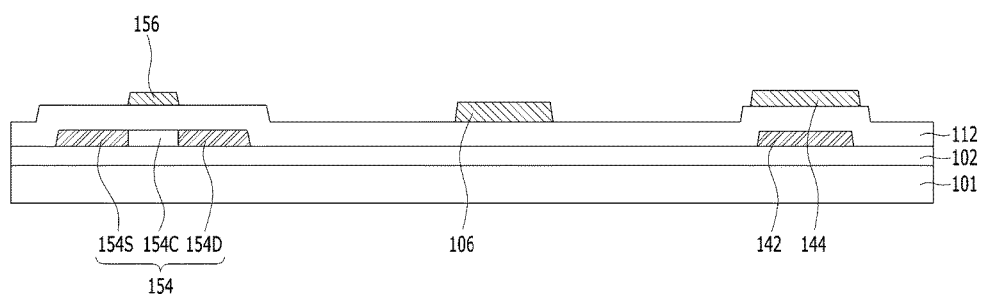

Referring to FIG. 6B, the first gate insulation film 112 is formed on the substrate 101, on which the polycrystalline semiconductor layer 154 and the lower storage electrode 142 have been formed, and the first and second gate electrodes 106 and 156 and the intermediate storage electrode 144 are formed on the first gate insulation film 112.

Specifically, an inorganic insulation material such as SiOx is deposited on the entire surface of the substrate 101, on which the polycrystalline semiconductor layer 154 and the lower storage electrode 142 have been formed, thereby forming the first gate insulation film 112. Subsequently, a first conductive layer is deposited on the entire surface of the first gate insulation film 112, and the first conductive layer is patterned through a photolithography process using a third mask and an etching process, thereby forming the first and second gate electrodes 106 and 156 and the intermediate storage electrode 144.

Figure 6C:
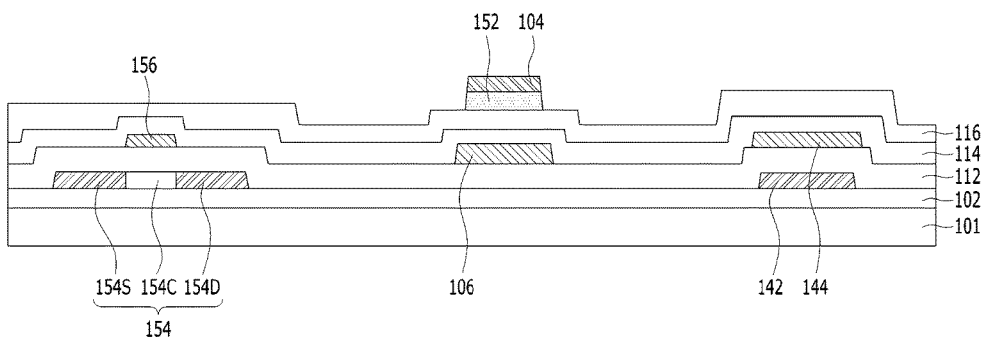

Referring to FIG. 6C, the first and second interlayer insulation films 114 and 116 are formed on the substrate 101, on which the first and second gate electrodes 106 and 156 and the intermediate storage electrode 144 have been formed, and the second gate insulation film 152 and the oxide semiconductor layer 104 are formed on the second interlayer insulation film 116 in the same pattern.

Specifically, an inorganic insulation material such as SiNx is deposited on the entire surface of the substrate, on which the first and second gate electrodes 106 and 156 and the intermediate storage electrode 144 have been formed, thereby forming the first and second interlayer insulation films 114 and 116. Subsequently, the second gate insulation film 152, which are formed of an inorganic insulation material such as SiOx, and the oxide semiconductor layer 104, are deposited on the entire surface of the second interlayer insulation film 116, and are patterned at the same time through a photolithography process using a fourth mask and an etching process, thereby forming the second gate insulation film 152 and the oxide semiconductor layer 104 in the same pattern. For example, an insulation film may be deposited on the substrate, and an oxide semiconductor layer may be deposited on the insulation film. The oxide semiconductor layer may be patterned using the fourth mask to form the oxide semiconductor layer 104, and the insulation film may be patterned using the same fourth mask to form the second gate insulation film 152.

Figure 6D:
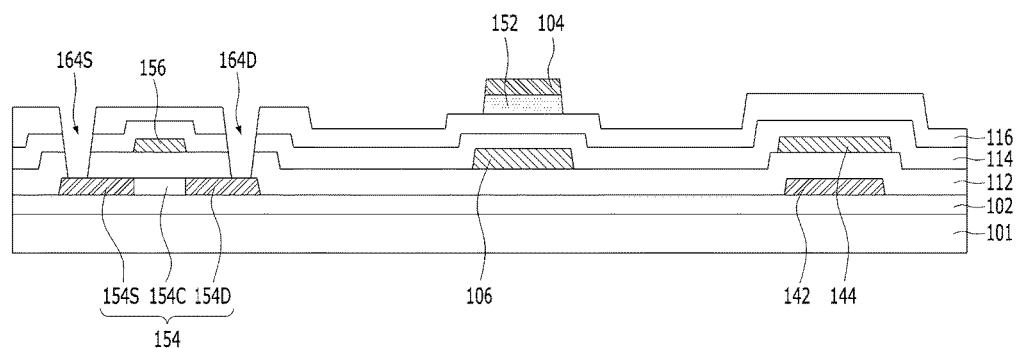

Referring to FIG. 6D, the source and drain contact holes 164S and 164D are formed on the substrate 101, on which the second gate insulation film 152 and the oxide semiconductor layer 104 have been formed.

Specifically, the first gate insulation film 112 and the first and second interlayer insulation films 114 and 116 disposed on the substrate 101, on which the second gate insulation film 152 and the oxide semiconductor layer 104 have been formed, are patterned through a photolithography process using a fifth mask and an etching process, thereby forming the source and drain contact holes 164S and 164D.

Figure 6E:
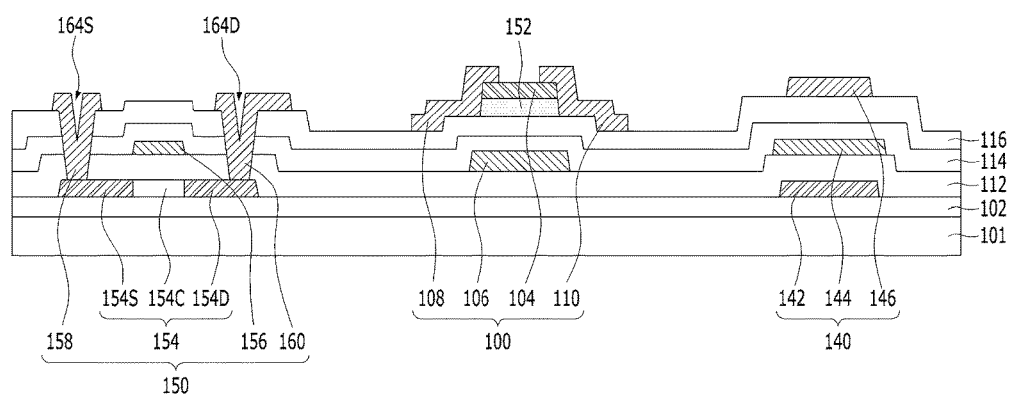

Referring to FIG. 6E, the first and second source electrodes 108 and 158, the first and second drain electrodes 110 and 160 and the upper storage electrode 146 are formed on the substrate 101, on which the source and drain contact holes 164S and 164D have been formed.

Specifically, a second conductive layer is deposited on the entire surface of the substrate 101, on which the source and drain contact holes 164S and 164D have been formed, and is patterned through a photolithography process using a sixth mask and an etching process, thereby forming the first and second source electrodes 108 and 158, the first and second drain electrodes 110 and 160, and the upper storage electrode 146. Due to patterning of the second gate insulation film 152, the upper storage electrode 146 does not contact the second gate insulation film 152, but may instead contact the second interlayer insulation film 116.

Figure 6F:
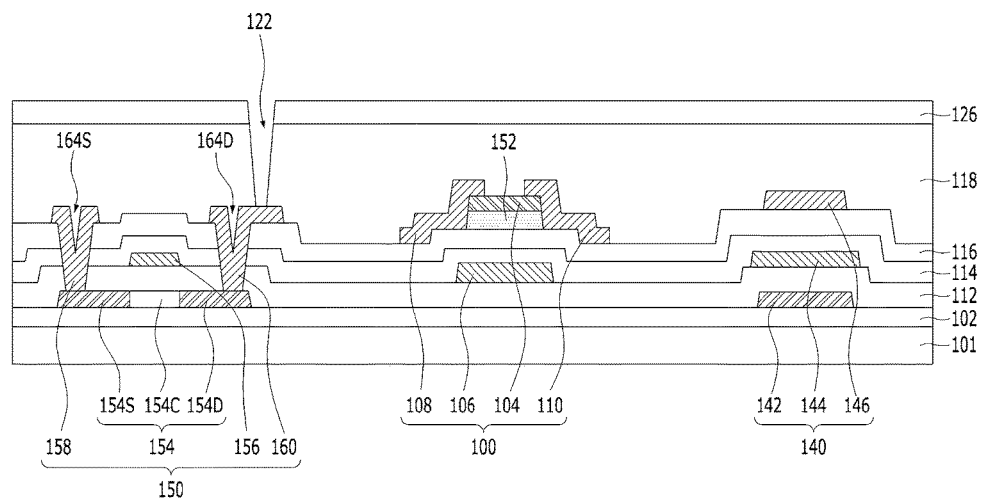

Referring to FIG. 6F, the first and second protective films 118 and 126 having therein the first pixel contact hole 122 are formed on the substrate 101, on which the first and second source electrodes 108 and 158, the first and second drain electrodes 110 and 160 and the upper storage electrode 146 have been formed.

Specifically, the first and second protective films 118 and 126 are sequentially formed on the substrate 101, on which the first and second source electrodes 108 and 158, the first and second drain electrodes 110 and 160 and the upper storage electrode 146 have been formed, through a deposition process. Here, the first and second protective films 118 and 126 are formed of an inorganic insulation material such as SiOx or SiNx or an organic insulation material such as an acrylic resin. Subsequently, the first and second protective films 118 and 126 are patterned through a photolithography process using a seventh mask and an etching process, thereby forming the first pixel contact hole 122.

Figure 6G:
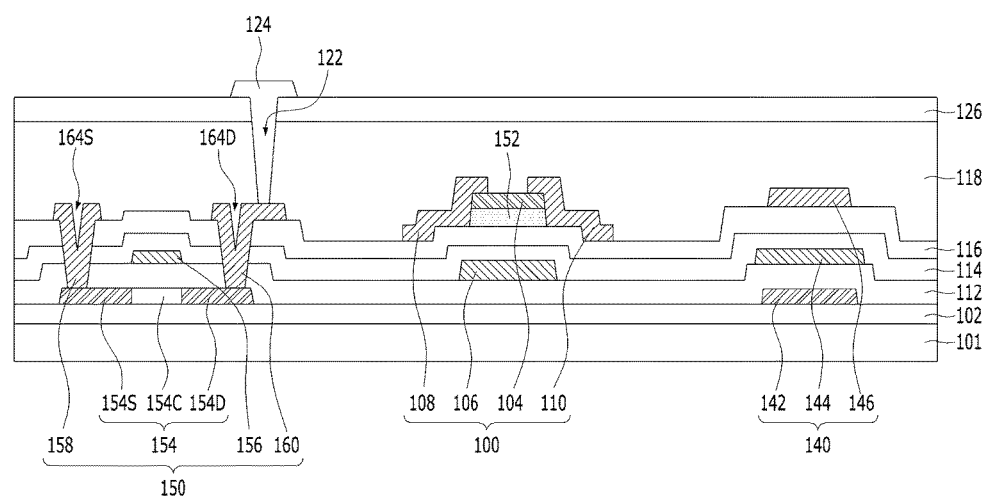

Referring to FIG. 6G, the pixel connection electrode 124 is formed on the substrate 101, on which the first and second protective films 118 and 126 having the first pixel contact hole 122 have been formed.

Specifically, a third conductive layer is deposited on the entire surface of the substrate 101, on which the first and second protective films 118 and 126 having the first pixel contact hole 122 have been formed, and is patterned through a photolithography process using an eighth mask and an etching process, thereby forming the pixel connection electrode 124.

Figure 6H:
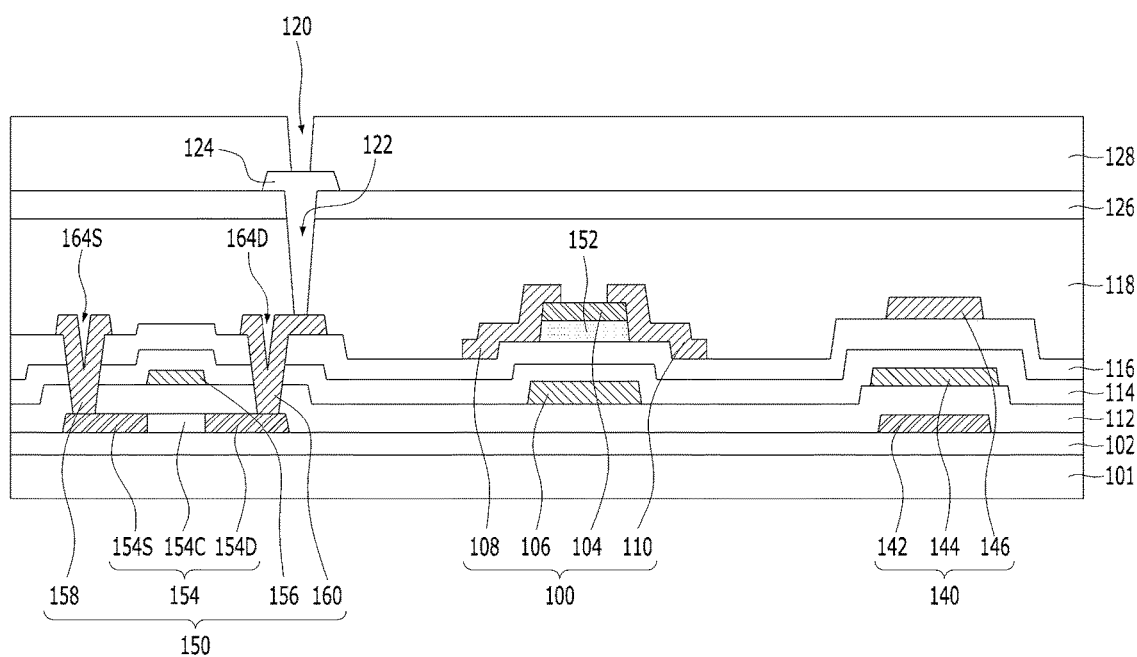

Referring to FIG. 6H, the planarization layer 128 having the second pixel contact hole 120 is formed on the substrate 101, on which the pixel connection electrode 124 has been formed.

Specifically, an organic insulation material such as acrylic resin is deposited on the entire surface of the substrate 101, on which the pixel connection electrode 124 has been formed, thereby forming the planarization layer 128. Subsequently, the planarization layer 128 is patterned through a photolithography process using a ninth mask and an etching process, thereby forming the second pixel contact hole 120.

Figure 6I:
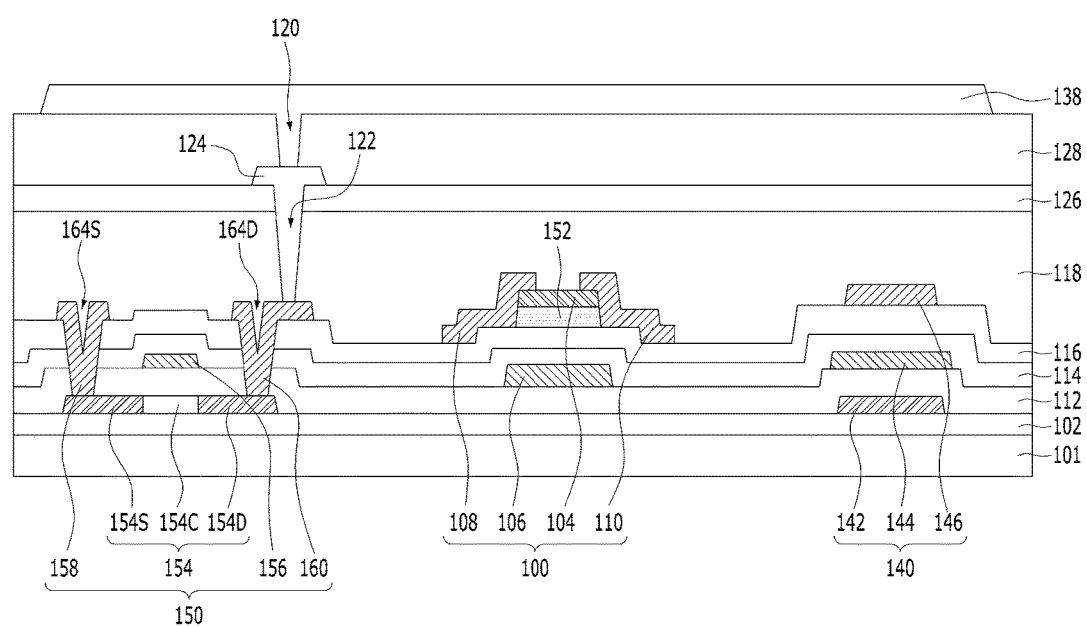

Referring to FIG. 6I, the anode 132 is formed on the substrate 101, on which the planarization layer 128 having the second pixel contact hole 120 has been formed.

Specifically, a fourth conductive layer is deposited on the entire surface of the substrate 101, on which the planarization layer 128 having the second pixel contact hole 120 has been formed. The fourth conductive layer includes a transparent conductive film and an opaque conductive film. Subsequently, the fourth conductive layer is patterned through a photolithography process and an etching process, thereby forming the anode 132.

Figure 6J:
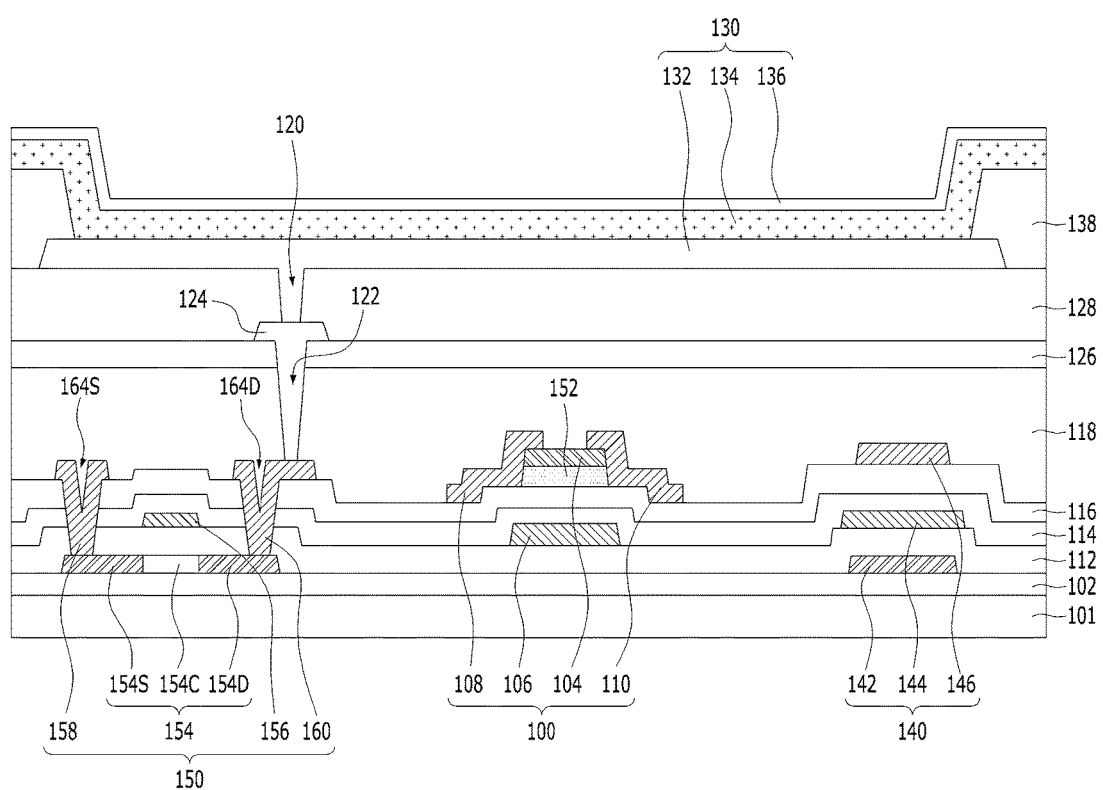

Referring to FIG. 6J, the bank 138, the organic light-emitting stack 134 and the cathode 136 are sequentially formed on the substrate 101, on which the anode 132 has been formed.

Specifically, a photosensitive film is coated on the entire surface of the substrate 101, on which the anode 132 has been formed, and is patterned through a photolithography process, thereby forming the bank 138. Subsequently, the light-emitting stack 134 and the cathode 136 are sequentially formed in the display area AA, but not the non-display area NA, through a deposition process using a shadow mask.

As such, according to the present disclosure, the intermediate storage electrode 144 and the gate electrodes 106 and 156 are formed through the same single mask process, and the upper storage electrode 146 and the source and drain electrodes 108, 158, 110 and 160 are formed through the same single mask process. Accordingly, the organic light-emitting display device according to the present invention may obviate one or more mask processes, as compared to the prior art, thereby simplifying the structure and the manufacturing process thereof and improving productivity.

As is apparent from the above description, the present disclosure may achieve lower power consumption and low-voltage operation by applying a thin-film transistor including an oxide semiconductor layer to a thin-film transistor positioned in a display area. In addition, the present disclosure may reduce the number of driving integrated circuits and reduce a bezel area by applying a thin-film transistor including a polycrystalline semiconductor layer to a gate-driving unit positioned in a non-display area and a multiplexer. In addition, according to the present disclosure, one of at least two storage electrodes is formed simultaneously with a gate electrode through the same single mask process, and another one of the at least two storage electrodes is formed simultaneously with source and drain electrodes through the same single mask process. Accordingly, an organic light-emitting display device according to the present invention is capable of reducing one or more mask processes, as compared to the prior art, thereby simplifying the structure and the manufacturing process thereof and improving productivity.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
   a substrate;
   a pixel on the substrate, the pixel including:
      a first thin-film transistor (TFT) on the substrate, the first TFT including:
         a first gate electrode,
         at least a first part of a first interlayer insulation film on the first gate electrode,
         a second interlayer insulation film on the first interlayer insulation film,
         a first gate insulation film on the first part of the second interlayer insulation film, and
         a first active layer formed of oxide semiconductor on the first gate insulation film;
      a second TFT on the substrate, the second TFT including:
         a second active layer formed of polycrystalline silicon,
         at least a first part of a second gate insulation film on the second active layer, and
         a second gate electrode on the first part of the second gate insulation film,
         wherein the first interlayer insulation film, the second interlayer insulation film, and the second gate insulation film are between the first active layer and the second active layer;
      a storage capacitor on the substrate, the storage capacitor including:
         a first storage electrode,
         at least a second part of the second interlayer insulation film on the first storage electrode, and
         a second storage electrode on the second part of the second interlayer insulation film, wherein the second storage electrode is physically separated from the first gate insulation film; and
      a light-emitting device electrically connected to the storage capacitor.

2. The display device of claim 1, wherein the first gate insulation film and the second storage electrode contact the second interlayer insulation film.

3. The display device of claim 1, wherein the first storage electrode is in a same layer as the first gate electrode.

4. The display device of claim 1, wherein the first interlayer insulation film and the second interlayer insulation film is formed of silicon nitride (SiNx) and the first gate insulation film is formed of silicon oxide (SiOx).

5. The display device of claim 1, wherein the first TFT further includes a first source electrode and a first drain electrode electrically connected to the first active layer, and wherein the second storage electrode is in a same layer as the first source electrode and the first drain electrode.

6. The display device of claim 1, wherein the first TFT further includes a first source electrode and a first drain electrode electrically connected to the first active layer, and wherein the first source electrode or the first drain electrode contacts a side surface of the first gate insulation film.

7. The display device of claim 6, wherein the first source electrode or the first drain electrode contacts a side surface of the first active layer.

8. The display device of claim 1,
   wherein the second gate electrode is in a same layer as the first gate electrode.

9. The display device of claim 1, wherein the first active layer is disposed above the second active layer.

10. The display device of claim 1, further comprising a third TFT disposed in a non-display area of the substrate, the third TFT including a third active layer formed of poly-Si.

11. The display device of claim 10, further comprising:
    a gate-driving unit disposed in the non-display area to drive gate lines in a display area of the substrate;
    a data-driving unit disposed in the non-display area for driving data lines in the display area; and
    a multiplexer for distributing data voltage from the data-driving unit to the data lines,
    wherein the third TFT is included in at least one of the multiplexer and the gate-driving unit.

12. The display device of claim 1, wherein the first TFT is a switching TFT of the pixel, and wherein the second TFT is a driving TFT of the pixel.

13. The display device of claim 1, wherein the storage capacitor further includes a third storage electrode on the substrate, and at least a second part of the second insulation film on the third storage electrode.

14. The display device of claim 13, wherein the third storage electrode is in a same layer as the second active layer.

15. The display device of claim 1, wherein the light-emitting device comprises an anode electrode, a light-emitting stack, and a cathode electrode, wherein the anode electrode overlaps with the first TFT, the second TFT, and the storage capacitor.

16. The display device of claim 1, wherein the light-emitting device comprises an anode electrode, a light-emitting stack, and a cathode electrode, wherein the second TFT includes a drain electrode electrically connected to the second active layer, and wherein the display device further comprises a connection electrode electrically connected to the drain electrode and the anode electrode.

17. The display device of claim 1, wherein the light-emitting device comprises an anode electrode, a light-emitting stack, and a cathode electrode, and wherein the anode electrode includes a transparent conductive film and an opaque conductive film.

18. The display device of claim 1, wherein the light-emitting device comprises an anode electrode, a light-emitting stack, and a cathode electrode, wherein the display device further comprises a bank layer on at least a part of the anode electrode, and wherein the bank layer includes a light-shielding material selected from at least one among a color pigment and organic black and carbon materials.

19. The display device of claim 1, further comprising a color filter on the light-emitting device.

20. The display device of claim 1, wherein the second gate electrode has a smaller line width than the first gate electrode and the first storage electrode.

21. The display device of claim 1, wherein at least one of the second gate insulation film, the first interlayer insulation film, and the second interlayer insulation film is formed of silicon oxide (SiOx).

22. The display device of claim 1, wherein the first interlayer insulation film is formed of silicon oxide (SiOx), and the second gate insulation film and the second interlayer insulation film are formed of silicon nitride (SiNx).

* * * * *